United States Patent [19]

Takahashi

[11] 4,409,674
[45] Oct. 11, 1983

[54] SEMICONDUCTOR MEMORY

[75] Inventor: Yukio Takahashi, Sakata, Japan

[73] Assignee: Fujitsu Limited, Kanagawa, Japan

[21] Appl. No.: 180,453

[22] Filed: Aug. 22, 1980

[30] Foreign Application Priority Data

Aug. 23, 1979 [JP] Japan ................................ 54-107394

[51] Int. Cl.³ .............................................. G11C 7/06
[52] U.S. Cl. ..................................... 365/190; 365/205
[58] Field of Search ................ 365/205, 190, 207, 208

[56] References Cited

U.S. PATENT DOCUMENTS 4,297,598  10/1981  Smith .................................. 365/205

OTHER PUBLICATIONS

Dennison et al., Harper Cell Read Reference Circuit, IBM Tech. Disc. Bul., vol. 18, No. 9, 2/76, pp. 2902-2904.

*Primary Examiner*—Stuart N. Hecker
*Attorney, Agent, or Firm*—Staas & Halsey

[57] ABSTRACT

In a semiconductor memory which is provided with a memory cell array, word lines and bit lines for selecting a desired one of memory cells of the memory cell array and a detector circuit for detecting a read current of the selected memory cell, the detector circuit is composed of a pair of transistors having their bases cross-connected so that a hysteresis characteristic is provided by flowing a current in the transistors, and the current is controlled by a hysteresis control circuit to flow only when all word line potentials monitored by the hysteresis control circuit have become lower than a predetermined value, whereby to remove the influence of a noise in the detection of read information of the selected memory cell.

5 Claims, 5 Drawing Figures

SEMICONDUCTOR MEMORY

BACKGROUND OF THE INVENTION

1. Field of the Invention

This invention relates to a semiconductor memory, and more particularly to a semiconductor memory which is free from the influence of a noise produced in the detection of read-out information.

2. Description of the Prior Art

A semiconductor memory has an arrangement such, for example, as shown in FIG. 1 for detecting read-out information of the stored content of a selected memory cell. In FIG. 1, reference character MCA indicates a memory cell array in which a plurality of memory cells, each formed by a bipolar transistor, are arranged; SA designates a sense amplifier; and R1, R2 and $Q_1$, $Q_2$ respectively identify resistors and transistors which make up a detector circuit. Bias currents $I_1$ and $I_2$ are always applied to the transistors $Q_1$ and $Q_2$ for their high-speed operation and, in accordance with the store state of a selected memory cell, either one of read currents $Is_1$ and $Is_2$ for the memory cell array MCA is zero and the other assumes a certain value. Depending on this, voltage drops across the resistors R1 and R2 differ in magnitude and the difference voltage is amplified by the sense amplifier SA to produce a read output OUT. Reference character $V_R$ denotes a reference voltage which is applied to the bases of the transistors $Q_1$ and $Q_2$; and Vcc represents a power source voltage.

If the currents $Is_1$ and $Is_2$ are switched ideally, then the read output OUT becomes a correspondingly ideal one. In a transient state of the operation of a switching circuit accompanying a memory access, however, cases are sometimes met with, where $Is_1 = Is_2 = 0$ or $Is_1$, $Is_2 = 0$ to make the waveform of the read output OUT indistinct, resulting in a read error.

Assuming that the currents $Is_1$ and $Is_2$ vary each time an address ADDR is established, as shown in FIG. 2, the output OUT' from the sense amplifier SA may sometimes assume a level intermediate between levels "1" and "0" corresponding to the characteristic of the detector circuit as shown. That is, the output does not immediately reverse from the level "1" to "0" but assumes the intermediate level once and then reverses. Furthermore, when the relationship between the currents $Is_1$ and $Is_2$ are changed by a switching noise or the like, the output OUT corresponding thereto is obtained; namely, the output is affected by the noise. With increased capacity of the memory cell, the load on a word line increases and a hold current decreases. As a result of this, the rise and fall of the word line potential are delayed and the both detected currents concurrently flow to the same amplifier SA for a certain period of time, as described above; in this case, the intermediate level is introduced into the amplified output from the sense amplifier SA. This phenomenon is prominent when an address includes a skew. With a view to overcoming such a defect, there has been proposed such a circuit arrangement as shown in FIG. 3 in which the sense amplifier SA is a latch type one.

In FIG. 3, reference character Ish indicates a hold current. In this example, the sense amplifier SA operates only when the difference between the read currents $Is_1$ and $Is_2$ becomes larger than the hold current Ish; namely, the sense amplifier SA has a hysteresis characteristic. In other words, even if the waveforms of the read currents $Is_1$ and $Is_2$ are unstable, the waveforms do not directly appear in the sense amplifier SA because of the latch operation, and consequently the output waveform is improved. In this circuit arrangement, however, the hold current Ish flows at all times and the sense amplifier SA does not start its operation unless the difference between the read currents $Is_1$ and $Is_2$ exceeds the hold current Ish; namely, the circuit operation is delayed by the rise time until the above difference exceeds the hold current, resulting in the defect that the read rate is sacrificed.

SUMMARY OF THE INVENTION

It is an object of the present invention to provide a semiconductor memory which is free from the above defects of the prior art.

According to the present invention, in the semiconductor memory which comprises a memory cell array composed of a plurality of memory cells, work lines and bit lines for selecting a desired one of the memory cells, and a detector circuit for detecting a read current of the selected memory cell of the memory cell array, the detector circuit is composed of at least one pair of transistors having their bases cross-connected to provide a hysteresis characteristic which is maintained by the flow of a current in the transistors and a hysteresis characteristic control circuit is provided which monitors the word line potentials and applies the current to the detector circuit to provide the hysteresis characteristic only when all the word line potentials monitored have become lower than a predetermined potential.

DESCRIPTION OF THE PREFERRED EMBODIMENTS

Figure 1:
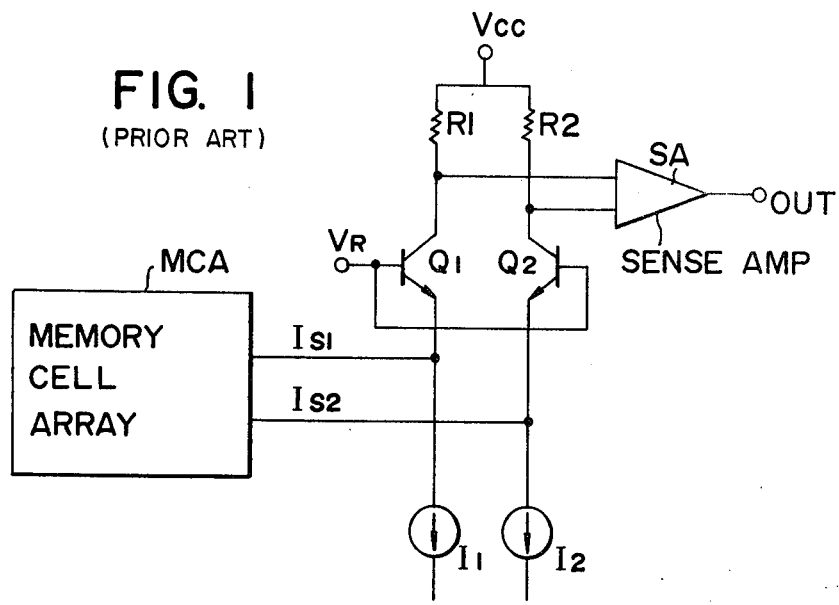
FIG. 1 is a circuit diagram illustrating an example of a detector circuit employed in conventional semiconductor memories.
Figure 2:
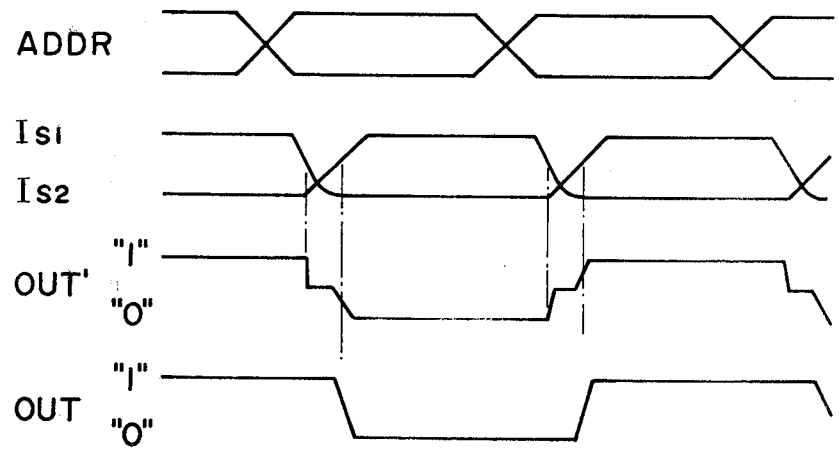
FIG. 2 is a timing chart explanatory of the operation of the circuit shown in FIG. 1.
Figure 3:
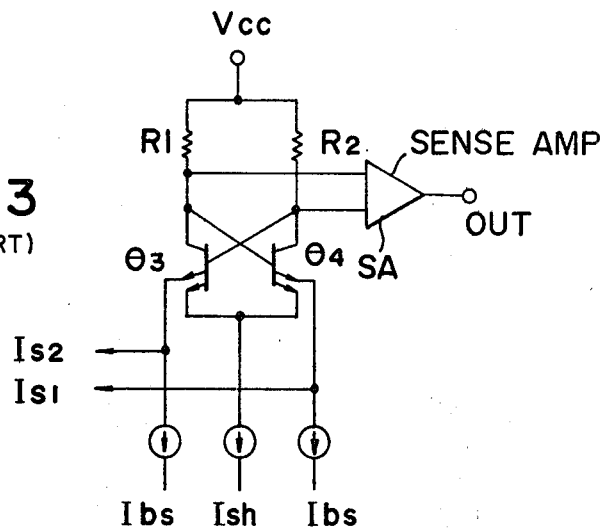
FIG. 3 is a circuit diagram illustrating an example of a conventional detector circuit which is improved but still defective.
Figure 5:
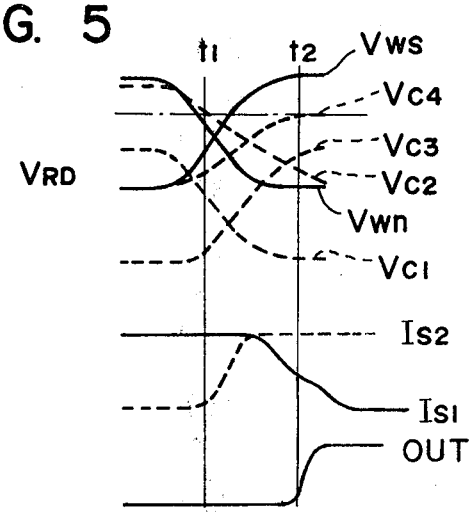
FIG. 5 is a timing chart explanatory of the operation of the embodiment shown in FIG. 4.
Figure 4:
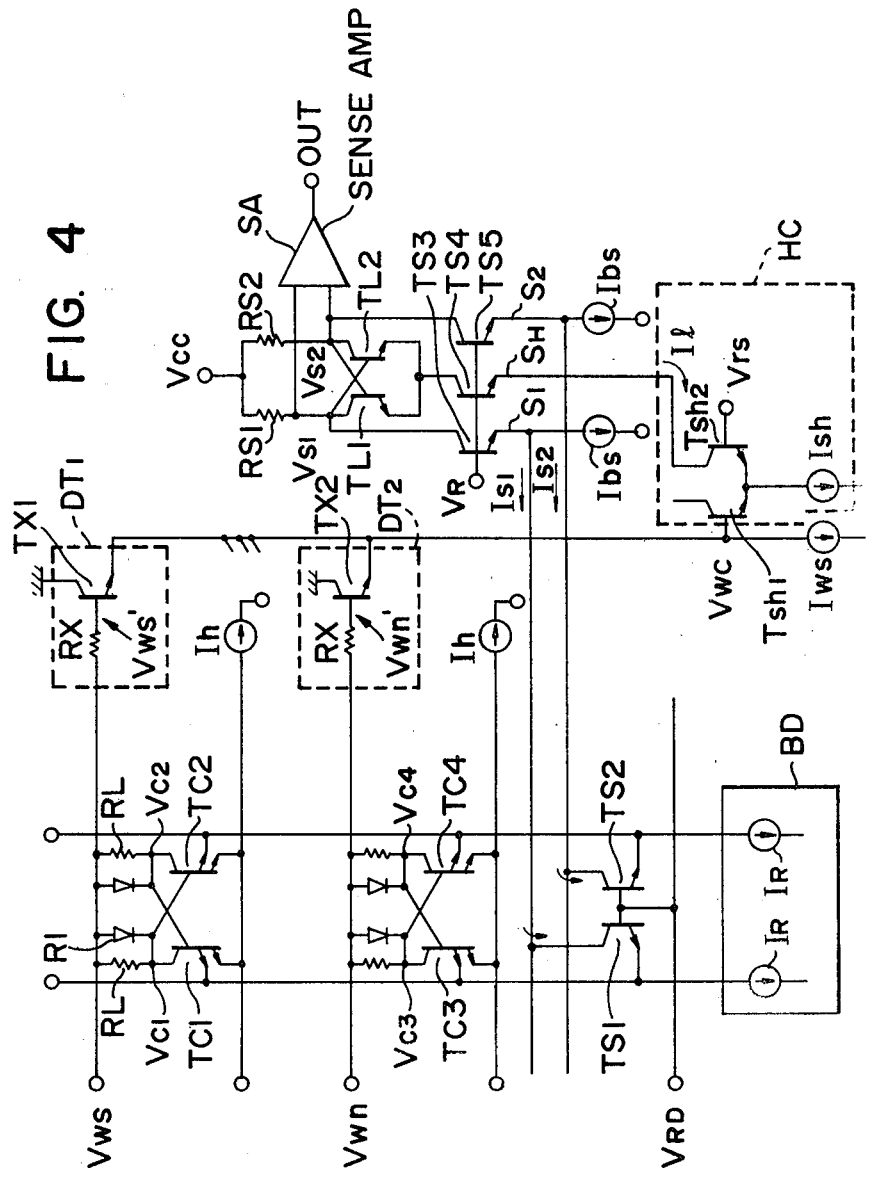
FIG. 4 is a circuit diagram showing the principal part of an embodiment of the present invention.

FIG. 4 illustrates an embodiment of the present invention, in which reference characters $DT_1$ and $DT_2$ indicate word line potential selection/non-selection detector circuits; HC designates a hysteresis characteristic control circuit which controls a hold current of a latch circuit added to a sense amplifier circuit and having a hysteresis characteristic; and BD identifies a bit line drive circuit which drives bit lines. Portions, each surrounded by two bit lines, a word line (for example, Vws) for driving a memory cell and a word line supplied with a current Ih for holding a stored content of the memory cell, are memory cells. The memory cells are assembled together to constitute a memory cell array. Reference characters TL1 and TL2 denote a pair of transistors which have their bases cross-connected and whose states are inverted by a current Il to provide a hysteresis characteristic. That is, the ON-OFF state of the transistors TL1 and TL2 is inverted when a difference between currents $Is_1$ and $Is_2$ exceeds a predetermined value defined by the current Il. The potential state of the word line represented by Vwc is the logical sum of the plurality of word line potential selection/non-selection detector circuits DT and becomes high-level when even one of the detector circuits DT is high-level. A transistor $Tsh_2$ is supplied with a predetermined reference potential Vrs and transistors $Tsh_1$ and $Tsh_2$ having their emitters interconnected compare the word line potential Vwc with the reference potential Vrs. In other words, the transistors $Tsh_1$ and $Tsh_2$ monitor the word line potential and when the word line potential Vwc has become lower than the predetermined potential Vrs, the transistor $Tsh_2$ is turned ON to permit the passage therethrough of the current Il which provides the hysteresis characteristic. Now, let it be assumed that transistors TC1 and TC4 are in the ON state in FIG. 4 and that a word line Vwn is selected first and then a word line Vws. When the potential of the word line Vwn changes from its high level to low level and the potential of the word line Vws changes from its low level to high level, potentials $Vc_1$ to $Vc_4$ and the currents $Is_1$ and $Is_2$ vary as shown in FIG. 5. With increased capacity of the memory cell, a load on the word line increases and a load resistance R of the cell also increases. Accordingly, as will be seen from FIG. 4, the collector potential of the cell on the side of the transistor in the ON state rapidly follows up the word line potential because of low impedance, but the collector potential on the side of the transistor in the OFF state appreciably lags the word line potential because of high impedance. In this course of transition, that is, in an address undecided region, transistors are turned ON at the same time and the two input potentials of the sense amplifier circuit become equal to each other, introducing an intermediate level in the course of transition, as will be described in detail later on.

In the present invention, the word line potentials are detected by resistors RX and transistors TX in the word selection/non-selection detector circuits DT and the emitters of the transistors are connected in common, by which the highest potential is always provided on the work line Vwc. Since this potential drops when an address is changed over, it is compared with the reference voltage Vrs and the current Il is applied to the pair of transistors TL1 and TL2 at the preceding stage of the sense amplifier circuit SA for a predetermined period of time (the transistors $Tsh_1$ and $Tsh_2$ making up a current switch). The time for which a current Ish (and consequently the current Il) is applied is determined by suitably setting up the resistance value of the resistor RX and the reference voltage Vrs. Transistors TS3, TS4 and TS5 are provided for cutting off capacitances parasitic on lines $S_1$, $S_2$ and $S_H$ to enable a high-speed operation. A current Ibs is applied to each of the transistors TS3 and TS5 to hold it in the ON state at all times for speeding up its operation. When the word line is switched, the current $Is_1/Is_2$ causes a current $I_R$ to flow in the both bit lines; if the hold current I does not exist, then $Vs_1 = Vs_2 = Vcc - RS(I_R + Ihs)$ and $Vs_1$ and $Vs_2$ become equipotential, resulting in the output assuming an intermediate level. In the circuit of the present invention, however, the current Il (Ish) flows when the word line is changed over, and since the current Il flows via the transistor TL1 when the potential $Vs_1$ is low-level and the potential $Vs_2$ high-level, $Vs_1 = Vcc - Rs(Il + I_R + Ibs)$ and $Vs_2 = Vcc - RS(I_R + Ibs)$, holding the potential $Vs_1$ low-level and the potential $Vs_2$ high-level. When the word line potential Vws becomes high-level, the current Il becomes zero, the current $Is_1$ becomes zero and the current $Is_2$ becomes equal to the current $I_R$. Consequently, $Vs_1 = Vcc - RsIbs$ and $Vs_2 = Vcc - RS(Ibs + I_R)$; namely, the potential $Vs_1$ becomes high-level and the potential $Vs_2$ low-level. Accordingly, according to the present invention, in the address undecided region in which the address is changed over, the hysteresis characteristic acts to hold the pair of transistors TL1 and TL2 in their previous state, preventing equal potentials from being applied to the sense amplifier circuit SA. Moreover, since the hysteresis characteristic is removed when the address has once been decided, the state can be changed rapidly without being affected by the hysteresis characteristic.

As has been described in the foregoing, according to the present invention, since the possibility of the detected output assuming the intermediate level is eliminated and since a high-speed operation is made possible, the output from the device, that is, an input signal to a logical circuit of the next stage becomes highly reliable, thus preventing an erroneous operation of the logical circuit and avoiding an overhead such as the provision of an extra noise margin.

It is a matter of course that the present invention need not always be limited specifically to the circuit arrangement described above but may also be any circuit arrangements which performs a similar operation, and the basic idea of the present invention is construed only by the appended claim.

What is claimed is:

1. A semiconductor memory which is provided with a memory cell array composed of a plurality of memory cells, word lines and bit lines for selecting a desired one of the memory cells, the semiconductor memory comprising: a detector circuit for detecting a read current of the selected memory cell of the memory cell array, said detector circuit including a pair of transistors having their bases cross-connected to provide a hysteresis characteristic which is obtained by applying currents to the transistors, and a hysteresis characteristic control circuit which monitors the potentials of the word lines and effects a flow of current to the pair of transistors for providing the hysteresis characteristic only when all the word line potentials have become lower than a predetermined potential, said detector circuit retaining data read immediately before while being supplied with said flow of current.

2. A semiconductor memory which is provided with a memory cell array composed of a plurality of memory cells, word lines and bit lines for selecting a desired one of the memory cells, comprising:

a detector circuit for detecting a read current of the selected memory cell of said memory cell array;

means included as part of said detector circuit for providing hysteresis characteristics thereto so that said detector circuit can retain data read immediately before; and means for monitoring the potentials of said word lines and effecting a flow of current for providing the aforesaid hysteresis characteristics only when all the word line potentials are lower than a predetermined potential.

3. A semiconductory memory as set forth in claim 2, wherein said means for providing hysteresis characteristics include a pair of transistors having their bases cross-connected.

4. A semiconductory memory as set forth in claim 3, wherein said means for monitoring the potentials of said word lines and effecting a flow of current for providing said hysteresis characteristics includes a hysteresis characteristic control circuit.

5. A semiconductory memory as set forth in claim 2, wherein said means for monitoring the potentials of said word lines and effecting a flow of current for providing said hysteresis characteristics includes a hysteresis characteristic control circuit.

* * * * *

UNITED STATES PATENT AND TRADEMARK OFFICE
CERTIFICATE OF CORRECTION

PATENT NO.  : 4,409,674
DATED       : October 11, 1983
INVENTOR(S) : Yukio Takahashi It is certified that error appears in the above-identified patent and that said Letters Patent is hereby corrected as shown below:

Front page [73], "Kanagawa" should be --Kawasaki--.

Column 4, line 28, "claim" should be --claims--.

Claim 3, line 1, "semiconductory" should be --semiconductor--.

Claim 4, line 1, "semiconductory" should be --semiconductor--.

Claim 5, line 1, "semiconductory" should be --semiconductor--.

Signed and Sealed this

Twenty-eighth Day of February 1984

[SEAL]

Attest:

GERALD J. MOSSINGHOFF

Attesting Officer

Commissioner of Patents and Trademarks